United States Patent [19]

Vokey

[11] 4,386,231

[45] May 31, 1983

[54] CABLE ASSEMBLY FOR DETECTING THE INGRESS OF WATER INSIDE A CABLE

[75] Inventor: David E. Vokey, Winnipeg, Canada

[73] Assignee: Canada Wire and Cable Limited, Toronto, Canada

[21] Appl. No.: 258,048

[22] Filed: Apr. 28, 1981

[30] Foreign Application Priority Data

Apr. 30, 1980 [CA] Canada .................................. 350990

[51] Int. Cl.³ .......................... H01B 7/32; G01R 31/08
[52] U.S. Cl. .................................. 174/115; 174/11 R; 324/52; 340/604
[58] Field of Search .......................... 174/11 R, 115; 200/61.04, 61.05, 61.06; 340/604, 605; 73/40.5 R; 324/52

[56] References Cited

U.S. PATENT DOCUMENTS

| | | | |
|---|---|---|---|
| 539,939 | 5/1895 | Gharky | 174/115 X |
| 1,157,208 | 10/1915 | Conrad | 174/115 |
| 2,056,085 | 9/1936 | Alles | 174/115 X |
| 3,031,523 | 4/1962 | Howard, Jr. | 174/102 R |
| 3,588,776 | 6/1971 | Horwinski | 174/115 X |

FOREIGN PATENT DOCUMENTS

| | | | |
|---|---|---|---|
| 36581 | 9/1926 | Denmark | 174/115 |
| 1065490 | 9/1959 | Fed. Rep. of Germany | 174/115 |
| 1490609 | 7/1969 | Fed. Rep. of Germany | 174/115 |

*Primary Examiner*—Laramie E. Askin
*Attorney, Agent, or Firm*—Fleit, Jacobson & Cohn

[57] ABSTRACT

A cable assembly for detecting the ingress of water inside a cable is disclosed. The cable assembly comprises a moisture detecting tape constructed of two parallel bare conductors laminated to an insulating substrate. The tape thus constructed is applied in an open helix around the conductor core of a cable. A suitable plastic jacket is extruded over the cable core and the moisture detecting tape. A shielding tape may also be applied over the cable core and the moisture detecting tape prior to extrusion of the overall plastic jacket. The cable thus constructed with the integral moisture detecting tape is adapted for connection to a suitable sensing apparatus at one end, and should moisture enter the cable as a result of damage to same, the electrical characteristics of the detecting tape would change and such change will result in a measurable conductance between the conductors of the moisture detecting tape. The ingressing water is thus sensed prior to penetrating and compromising the cable core. Standard bridge techniques are employed to determine the distance of the fault from the ends of the cable.

8 Claims, 4 Drawing Figures

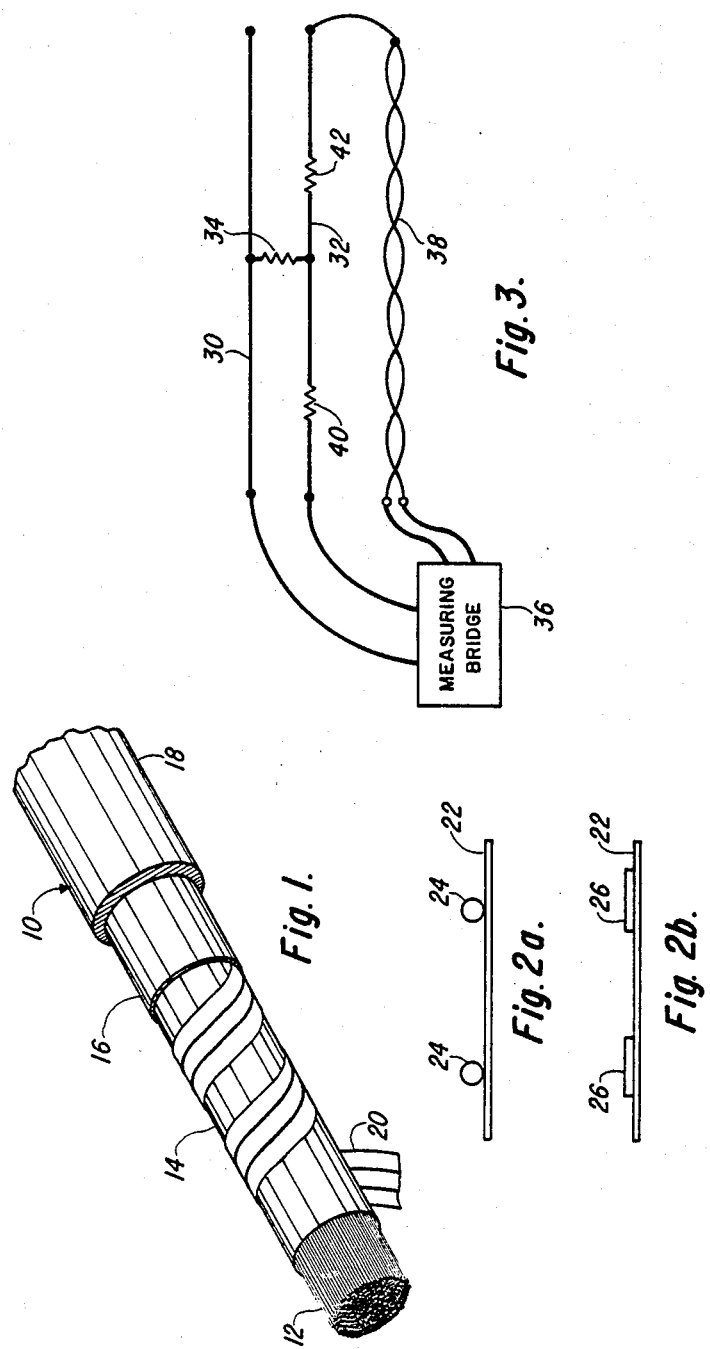

CABLE ASSEMBLY FOR DETECTING THE INGRESS OF WATER INSIDE A CABLE

This invention relates to a cable assembly for detecting the ingress of water inside a cable, more particularly a telecommunication cable.

Ever since the first outside plant telephone cable was installed, great efforts have been made to provide and maintain acceptable transmission quality in the face of the elements, the most insidious and ubiquitous of these elements being water. Early cable designs involved the use of lead and lead alloy sheaths which, for the most part, were impervious to water, but they were still subject to damage and corrosion with water seeking out every weakness in the cable.

In the 1950's, plastic sheathed cables were developed. For a time, the quality of "communications" showed signs of rapid deterioration as vapour permeated through plastic sheaths and re-materialized inside the cable. In an attempt to solve this problem, pressurization and air drying were developed. However, pressurization and air drying required considerable investment in equipment and accessories which were costly and often bulky. There was also a maintenance burden involved. In addition, considerations such as "pneumatic resistance" have tended to sidetrack and obscure true objectives and purpose in cable design. Furthermore, communication cables by design are compact making effective use of materials and, as a result, such cables do not readily lend themselves to pressurization which is the physical pumping of air through the cable cores.

It is, therefore, the object of the present invention to provide a cable assembly for detecting ingress of water inside a cable which substantially overcomes the above-mentioned drawbacks.

The cable assembly, in accordance with the present invention, comprises a moisture detecting tape constructed of spaced bare conductors laminated to an insulating substrate which serves to hold the spaced conductor configuration. As used herein, moisture refers to water in its liquid state as opposed to water vapor or humidity. The tape thus constructed is applied in an open helix over the cable core and the moisture detecting tape. The moisture detecting tape is provided with suitable terminals for connection to a sensing device placed at one end of the cable for detecting a measurable conductance change between the conductors of the tape in case moisture enters the cable jacket.

A metallic shield tape may be applied over the complete core and the integral moisture tape. In such a case, the insulating substrate of the moisture detecting tape is placed facing outward to insulate the moisture detecting conductors of the tape from the metallic shield.

The conductors of the moisture detecting tape may be round or rectangular, depending on preferred geometry. The conductors may be sandwiched between the above mentioned insulating substrate and a porous tape to more positively hold the spaced conductor configuration while permitting any water present to contact the conductors of the tape.

To facilitate location of a water breach, the excess length of the moisture detecting tape in an open helix around the cable core is preferably of a decided value for all core and cable sizes. To achieve a fixed excess length, it is required that the angle of application $\theta$ of the detection tape be held constant for all core sizes.

The excess length of the detection tape in an open helix configuration is given by the well known formula:

$$SEC\,\theta = \sqrt{1 + \left(\frac{\pi(D+d)}{L}\right)^2}$$

where:
D is the cable core diameter
d is the detection tape thickness
L is the detection tape lay The angle of application $\theta$ of the detection tape is preferably 20° to 30°, most preferably about 25°.

The invention will now be disclosed, by way of example, with reference to the accompanying drawings in which FIG. 1 illustrates a perspective view of a telecommunication cable equipped with the moisture detecting tape in accordance with the invention;

FIGS. 2a and 2b are schematic diagrams of suitable moisture detecting tapes; and FIG. 3 illustrates a typical technique employed to determine the distance of a fault from the ends of the cable equipped with the moisture detecting tape in accordance with the invention.

With reference to the drawings, FIG. 1 shows a multi-conductor telephone cable 10 with a multi-conductor cable core 12 over which a suitable core wrap 14, such as polyester, is applied longitudinally or helically to insulate the core from a shield 16 applied over the core wrap and to protect the core from the heat of extrusion of a plastic jacket 18 applied over the shield. The invention relates to the placing of a novel moisture detecting tape 20 between the cable core 12 and overall core wrap 14 on one hand, and the cable shield 16 and the overall cable jacket 18 on the other hand. The moisture detecting tape 20 thus placed provides a sensing circuit between the protective jacket 18 and shield 16 when applied and the communication circuits within the cable core 12. It is to be understood that, in some cables, the metallic shield may not be needed and that the cable jacket will be placed right over the cable core and moisture detecting tape.

Referring to FIGS. 2a and 2b, two suitable detecting tape constructions are illustrated schematically. Each tape construction includes an insulating substrate 22 constructed of a polyester or other suitable material of about 0.1 mm in thickness and about 6 cm in width. To the insulating substrate 22, either round conductors 24 (FIG. 2a) or rectangular conductors 26 (FIG. 2b) of suitable size are laminated thus forming a detecting conductor pair with the substrate 22 and maintaining a suitable separation between the conductors of the tape. In order to more positively maintain separation between the conductors of the tape, a porous tape (not shown) may be applied over conductors on the side opposite to the insulating substrate. The porous sheet will permit any water entering the cable jacket to contact the conductors of the moisture detecting tape.

In cable designs where a metallic shield is applied over the cable core under the overall jacket, such as shown in FIG. 1, the moisture detecting tape 20 is applied in an open helix about the cable core wrap 14 with the insulating substrate 22 (FIG. 2) facing outwards form the centre of the cable core 12. Thus placed the insulating substrate insulates the moisture detecting conductors 24 or 26 (FIG. 2a, FIG. 2b) from the metallic shield 16 when such shield is used. However, an mentioned previously, some cable designs do not require such metallic shield and thus the insulating substrate of the moisture detecting tape does not have to be placed facing outwards from the centre of the cable core.

The angle of application $\theta$ of the moisture detecting tape 20 is preferably selected to be 20°–30°, preferably about 25° to provide an excess of moisture detecting tape 20 of 6–15%, preferably about 10% irrespective of the size of the cable core 12. Such an excess is given by SEC $\theta$ in equation (1) above. For example, an excess length of 10% ($\theta=25°$) would give a tape lay L of about 17 cms for a 2.5 cm cable core diameter and of about 50 cms for a 3.75 cm cable core diameter. A tape lay of that order provides reasonable identification of the location of a leak in the cable. As mentioned previously, the angle of application $\theta$, once selected, is maintained constant in order to insure a predictable dc resistance per cable meter of the moisture detecting conductors.

Referring now to FIG. 3, a fault measuring technique is described. The moisture detecting conductors, as represented by numerals 30 and 32, are bridged at a point along the length by a moisture fault which manifests itself as a fault resistance 34 of an unknown value. A measuring bridge 36 is connected to the moisture detecting conductors 30 and 32 and applies a measuring voltage between the moisture detecting conductors. The far end of moisture detecting conductor 32 is "brought back" and connected to the measuring bridge 36 on a "good pair" 38 within the cable core. The circuit thus connected can, by employing well known resistance bridge techniques, determine the values of resistance 40 of the moisture detecting conductor 32 from the measuring bridge 36 to the fault 34 and the value of resistance 42 from the fault 34 to the end of the moisture detecting conductor 32. The resistances 40 and 42 thus measured allow for distance calculations from either end of the line of the point of the cable fault.

Although the invention has been disclosed with reference to a preferred embodiment, it is to be understood that the moisture detecting tape may take other shapes and that the invention is to be limited by the scope of the claims only.

The embodiments of the invention in which an exclusive property or privilege is claimed are defined as follows:

1. A telecommunications cable assembly for detecting the ingress of water inside the core of a telecommunications cable while being insensitive to the presence of water vapor in the cable, said cable assembly comprising
    (a) a moisture detecting tape constructed of two spaced apart bare conductors laminated to an insulating plastic substrate and applied in an open helix around the core of the telecommunications cable;
    (b) a plastic jacket extruded over the cable core and the moisture detecting tape; and
    (c) means for connecting the conductors on the tape to a sensing device for detecting a measurable conductance change between the conductors in case water enters the cable jacket and bridges the gap between the two conductors.

2. A telecommunications cable assembly as defined in claim 1, wherein a metallic shield is applied over the moisture detecting tape and the cable core before applying the plastic jacket and wherein the tape is applied with the insulating substrate facing outwards from the cable core so as to permit the insulating substrate to insulate the conductors of the tape from the metallic shield.

3. A telecommunications cable assembly as defined in claim 1, wherein the conductors of the detecting tape are round conductors which are glued to the insulating substrate to maintain a suitable separation between the conductors.

4. A telecommunications cable assembly as defined in claim 3, wherein the conductors are sandwiched between said insulating substrate and a porous tape permitting water to contact the conductors of the tape in case of ingress of water into the telecommunications cable core.

5. A telecommunications cable assembly as defined in claim 1, wherein the excess of length SEC $\theta$ of the detecting tape in an open helix configuration is given by $$SEC\,\theta = \sqrt{1 + \left(\frac{\pi(D+d)}{L}\right)^2}$$

where:
D is the cable core diameter
d is the detection tape thickness
L is the detection tape lay 6. A telecommunications cable assembly as defined in claim 5, wherein the angle of application of the detecting tape is selected to be a constant angle of between 20° and 30°.

7. A telecommunications cable assembly as defined in claim 1, wherein the conductors of the detecting tape are flat conductors which are glued to the insulating substrate to maintain a suitable separation between the conductors.

8. A telecommunications cable assembly as defined in claim 7, wherein the conductors are sandwiched between the insulating substrate and a porous tape permitting water to contact the conductors of the tape in case of ingress of water into the telecommunications cable core.

* * * * *